United States Patent
Cannavale et al.

(10) Patent No.: US 11,189,433 B2
(45) Date of Patent: Nov. 30, 2021

(54) MULTIFUNCTIONAL SOLID-STATE DEVICES FOR SOLAR CONTROL, PHOTOVOLTAIC CONVERSION AND ARTIFICIAL LIGHTING

(71) Applicant: CONSIGLIO NAZIONALE DELLE RICERCHE, Rome (IT)

(72) Inventors: Alessandro Cannavale, Lecce (IT); Pierluigi Cossari, Rome (IT); Vincenzo Maiorano, Lecce (IT); Giuseppe Gigli, Lecce (IT)

(73) Assignee: CONSIGLIO NAZIONALE DELLE RICERCHE, Rome (IT)

(*) Notice: Subject to any disclaimer, the term of this patent is extended or adjusted under 35 U.S.C. 154(b) by 63 days.

(21) Appl. No.: 16/620,788

(22) PCT Filed: Jun. 8, 2018

(86) PCT No.: PCT/EP2018/065146
§ 371 (c)(1),
(2) Date: Dec. 9, 2019

(87) PCT Pub. No.: WO2018/224645
PCT Pub. Date: Dec. 13, 2018

(65) Prior Publication Data
US 2020/0127065 A1    Apr. 23, 2020

(30) Foreign Application Priority Data
Jun. 9, 2017 (IT) .......... 102017000064105

(51) Int. Cl.
*H01L 27/32* (2006.01)
*H01G 9/20* (2006.01)
(Continued)

(52) U.S. Cl.
CPC ....... *H01G 9/2009* (2013.01); *G02F 1/15165* (2019.01); *H01L 27/3227* (2013.01);
(Continued)

(58) Field of Classification Search
None
See application file for complete search history.

(56) References Cited

U.S. PATENT DOCUMENTS

| | | | |
|---|---|---|---|
| 5,298,235 A * | 3/1994 | Worrell ............... | H01M 8/1246 429/496 |
| 2009/0165857 A1* | 7/2009 | Naito .................. | H01L 51/4246 136/261 |

(Continued)

OTHER PUBLICATIONS

Ming-Che Yang, Hsun-Wei Cho and Jih-Jen Wu, "Fabrication of stable photovoltachromic cells using a solvent-free hybrid polymer electrolyte", Nanoscale, vol. 6, Jun. 16, 2014 (Jun. 16, 2014), p. 9541-9544.

(Continued)

*Primary Examiner* — Dung A. Le
(74) *Attorney, Agent, or Firm* — B. Aaron Schulman, Esq.; Stites & Harbison, PLLC

(57) ABSTRACT

A multifunctional solid-state photovoltachromic device (1) comprising at least one n-type layer (8) and at least one p-type layer (11) arranged to create a PN or PIN junction, said n-type layer (8) and p-type layer (11) comprising materials arranged to act as mixed conductors, thus allowing both charge transport and ion conduction.

8 Claims, 1 Drawing Sheet

(51) Int. Cl.
    *H01L 51/00*     (2006.01)
    *H01L 51/44*     (2006.01)
    *G02F 1/1516*     (2019.01)
    *G02F 1/15*     (2019.01)

(52) U.S. Cl.
    CPC ........ *H01L 51/0037* (2013.01); *H01L 51/442* (2013.01); *G02F 2001/15025* (2019.01); *H01L 2251/306* (2013.01); *H01L 2251/308* (2013.01)

(56) References Cited

U.S. PATENT DOCUMENTS

| | | | |
|---|---|---|---|
| 2010/0043873 A1* | 2/2010 | Kim | H01L 21/02483 |
| | | | 136/255 |
| 2010/0259811 A1 | 10/2010 | Wu et al. | |
| 2014/0196787 A1* | 7/2014 | Hanaki | C08G 61/126 |
| | | | 136/263 |
| 2017/0018369 A1* | 1/2017 | Nakamura | H01G 9/2031 |
| 2017/0084400 A1 | 3/2017 | Cheng et al. | |

OTHER PUBLICATIONS

Zhou Feichi et al., "Multifunctional perovskite photovoltachromic supercapacitor", 2016 IEEE International Nanoelectronics Conference (INEC), IEEE, May 9, 2016 (May 9, 2016), p. 1-2.
International Search for Application No. PCT/EP2018/065146, dated Aug. 13, 2018 European Patent Office, Rijswikj, NL.
Written Opinion for International Search for Application No. PCT/EP2018/065146, dated Aug. 13, 2018 European Patent Office, Rijswikj, NL.
Italian Search Report for IT 201700064105, dated Feb. 23, 2018.

\* cited by examiner

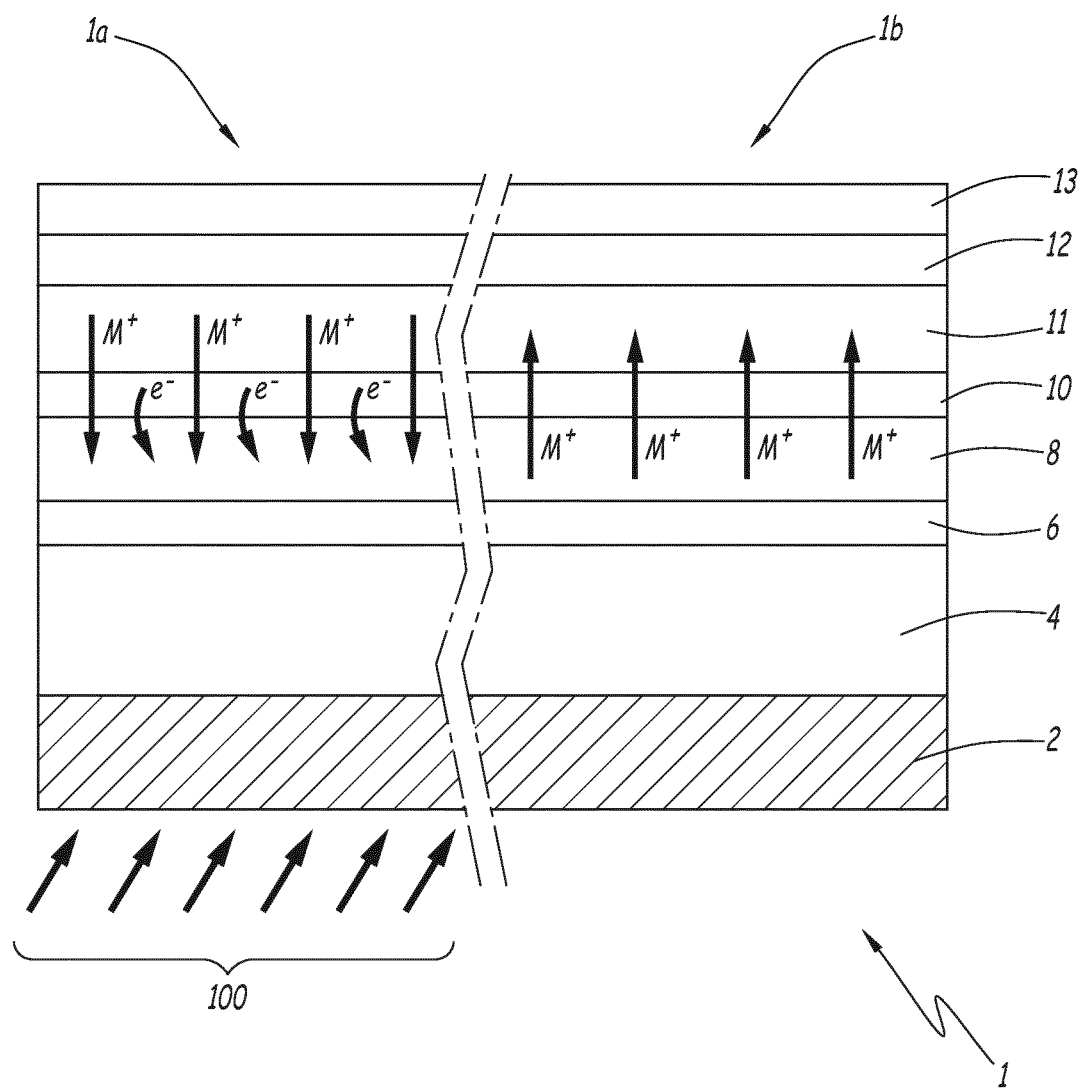

MULTIFUNCTIONAL SOLID-STATE DEVICES FOR SOLAR CONTROL, PHOTOVOLTAIC CONVERSION AND ARTIFICIAL LIGHTING

The present invention relates to a multifunctional device, in particular to a multifunctional solid-state photovoltachromic device for solar control, photovoltaic conversion, control of thermal gains and artificial lighting.

Photochromism generally refers to a reversible change in color by light absorption, electrochromism refers to an electrically induced change in color, photoelectrochromism refers to a change in color produced by photogenerated charge carriers and photovoltaic refers to generating a voltage by light absorption.

Both photochromic materials, which change color upon absorption of light for reversible transformation of a chemical species between two forms having different absorption spectra, and electrochromic materials, which change color in response to an electrically induced change in redox state, have shown great promise for the future, for example for the so called "smart" windows and information display applications.

One of the main problems occurring in the fabrication of electrochromic and photoelectrochromic devices consists in the adoption of liquid or gel electrolytes, lithium salts dissolved in flammable liquid or organic aprotic solvents, which confer strong instability and irregular responses to the devices. In addition, these liquid or gel electrolytes make the device fabrication processes not versatile and jeopardize the durability of the device, due to the evaporation of the solvents present within the electrolytes.

In fact, multifunctional devices of this type usually have a dual substrate. A typical procedure for obtaining such devices comprises the step of laminating two substrates in a sandwich type configuration, with the adoption of a gel electrolyte (or redox mediator) and an—often—unreliable sealing system.

In addition, the combination of different functionalities within a single device is generally obtained through a pattern wherein the various functionalities are placed side by side.

For example, the work of Wu et al., "*Fast-Switching Photovoltachromic Cells with Tunable Transmittance ACS Nano*, 2009, 3 (8), pp. 2297-2303" discloses a photovoltachromic device with a separated architecture, able to ensure the production of electricity by photovoltaic conversion and responsive transparency control.

The double functionality, i.e. photovoltaic and electrochromic, is obtained through a framed layout. In the outer region of the device there is the photoelectrode made of dye-sensitized $TiO_2$. On the portion corresponding to the counter-electrode there is a highly reflective platinum frame. As a result, a square transparent region is formed on the photoelectrode.

On the superficial area of the counter electrode corresponding to the square region, an electrochromic cathodic material is deposited, such as $WO_3$.

Therefore, a patterned $WO_3$/Pt counterelectrode allows the design of a frame-type layout. With this device, in short-circuit conditions under light irradiation, the PVCD shows fast coloration and fair photovoltaic characteristics ($\eta=0.50\%$). PVCDs could be bleached under illumination by simply opening the circuit.

A control of transmittance modulation, even in short-circuit conditions under light irradiation, was demonstrated by adopting resistors in series, showing different values of resistance. The device contains a liquid electrolyte consisting of a redox couple $I^-/I_3^-$, LiI salt and additives dissolved in organic solvent.

In a later work by Yang et al., "*Fabrication of stable photovoltachromic cells using a solvent-free hybrid polymer electrolyte*", Nanoscale, 2014, 6, 9541-9544, in a double-substrate photovoltachromic device a solventfree electrolyte based on polyethylene glycol (PEG) and titanium dioxide nanoparticle has been provided, showing high bleaching/coloration switching time and low durability, mainly due to a high interfacial resistance between the quasi-solid electrolyte and the electrochromic layer.

More recently, Cannavale et al., "*Perovskite photovoltachromic cells for building integration*", Energy Environ. Sci., 2015.8, 1578 to 1584, proposed a semi-transparent perovskite photovoltaic film with a solid polymer electrolyte-based electrochromic device to achieve a solid PVCD, realized by depositing the photovoltaic and electrochromic layers onto separated glass sheets.

In this case, a polymer electrolyte, belonging to the category of plasticized polymer electrolytes, based on high molecular weight PEO-LiI plasticized with PEG, was used as a glue to laminate two glasses and complete the electrochromic cell.

These quasi-solid electrolyte systems show suitable chemico-physical and ion conduction properties, conferring to perovskite based PVCD a good stability and long-term durability.

Other devices, disclosed in the prior art, have combined photovoltaic to electrochromic functionalities. For example, document U.S. Pat. No. 8,508,834 B2 overlaps a series of thin-film silicon-based cells on a polyelectrolyte, and to an electrochromic material. It is a single substrate with a plurality of solar cells on thin film and an electrochromic material.

In this case, even if the device is a multifunctional device (photovoltaic end electrochromic) on a single substrate, the electrolyte is of liquid type, and the combination of the various functionalities is based on placing side by side opaque portions and portions dedicated to the responsive modulation of transparency.

Other problems which affect prior art devices are associated to the higher energy consumption, as well as the higher manufacturing costs of the systems with respect to the most common solar control window films.

In view of the above, there is therefore the need to provide a multifunctional solid-state photovoltachromic device for solar control, photovoltaic conversion and artificial lighting, which has a simplified architecture deposited on a single substrate, and which is capable of obtaining multiple functionalities without the need to pattern them side by side, thus overcoming the limitations of the prior art solutions.

These and other objects are fully achieved by virtue of a multifunctional solid-state photovoltachromic device having the characteristics defined in independent claim 1.

Preferred embodiments of the invention are specified in the dependent claims, whose subject-matter is to be understood as forming an integral part of the present description.

In the multifunctional solid-state photovoltachromic device according to the present invention, thanks to the presence of materials able to function both in photovoltaic and electrochromic processes, i.e. having multiple functions, within a solid-state device with simplified architecture on a single substrate, it is possible to obtain a both photovoltaic and electrochromic process.

Further characteristics and advantages of the present invention will become apparent from the following description, provided merely by way of a non-limiting example, with reference to the enclosed drawings, in which:

FIG. 1 shows a sectional view of a multifunctional solid-state photovoltachromic device according to the present invention.

Briefly, in the multifunctional solid-state photovoltachromic device of the present invention (in the following simply referred to as device), an electrochromic function and a photovoltaic function are integrated thanks to the use of multifunctional solid layers. In this way, it is possible to activate several functions in a device obtained with a single stratigraphy and having a single layout on a single substrate.

The main focus of the invention is represented by the possibility of manufacturing, in a single stratigraphy of materials, and, therefore, on a single substrate, a multifunctional solid-state device capable of ensuring different features such as energy production by photovoltaic conversion, smart control of solar throughput and, finally, production of artificial lighting.

In the device of the present invention, materials with dual functionality are used to obtain PN junctions in which both of the materials act as mixed conductors, allowing both charge transport and ion conduction.

The present invention relates to a solid-state multifunctional device architecture on a single substrate, in particular photovoltachromic and photovoltaic, with two—or more than two—electrodes.

The functionalities of the device, guaranteed by the single solid stratigraphy on one substrate, are electrochromic (EC) and photovoltaic (PV).

The features of the device according to the present invention can be summarized in the following points:
- architectures of solid-state multifunctional device on a single substrate;
- use of multifuncional materials in the stratigraphic fabrication process of the device. For example, materials usually used as electrochromic show charge (electrons or holes) transportation properties and can therefore be used in photovoltaic devices.

More specifically, the device of the present invention includes a photovoltaic device based on a p-n (or p-i-n) junction that comprises p-type and n-type materials, both having the peculiarity of being "mixed conductors", i.e. being capable of conducting both charges and ions. For instance, the tungsten oxide $WO_3$ is simultaneously able to conduct, in predetermined conditions, both electrons (n-type conduction) and ions, thus allowing the intercalation phenomenon in the electrochromic coloration process.

Similarly, "mixed conductor" p-type materials capable of conducting both holes (p-type conduction) and ions (electrolyte), such as polyethylendioxythiophene (PEDOT), polyaniline (PANI), etc., take part in both electrochromic and photovoltaic processes.

In this way, two materials in charge for the separation of the generated holes/electrons from a photovoltaic layer, preferably, a perovskite layer, have also the function of allowing the coloring of the electrochromic material, by using a photovoltage generated under illumination.

FIG. 1 shows a sectional view of a device 1 according to the present invention, which is obtained using stratigraphic processes per se known.

Starting from the bottom, the device 1 comprises a substrate 2, preferably glass or polyethylene naphthalate (PEN), a transparent conductive oxide layer 4, such as indium tin oxide (ITO) or fluorine tin oxide (FTO) or graphene, and a n-type layer 8, such as $PCBM_{60}$, $TiO_2$, ZnO, $WO_3$, $MoO_3$, $TiO_2$, $V_2O_5$ and $VO_2$.

On top of the n-type layer 8 there is a semitransparent photovoltaic layer 10, such as perovskite, silicon or a polymer, then a mixed ion and p-type conductor layer 11, for example semiconducting polymers such as PANI, PANI:PSS, PEDOT, PEDOT:PSS, or mixed conducting oxides, which acts also as anodic electrochromic, and on top of the device 1 a counter electrode 13, made for example of metal such as Au, Al, Pt, Ag or LiF, or transparent conductive oxide such as ITO, FTO, AZO, or of carbon based electrodes such as graphene and carbon nanotubes.

In an alternative embodiment of the present invention, the device 1 further comprises a quasi solid and solid state electrolyte layer 6 acting as ion storage layer, organic or inorganic, such as polymer electrolyte (ionomers, gel polymer electrolytes, plasticized polymer electrolyte, ionic rubber polymer electrolyte), proton conducting oxides (ceramic proton and hydride ion conductors), hybrid inorganic-organic polymer electrolytes (HIO-PE), or block copolymers with ionic liquids, placed between the transparent conductive oxide layer 4 and the n-type layer 8.

In a further alternative embodiment of the present invention, the device 1 further comprises a quasi solid and solid state electrolyte layer 12 similar to the layer 6 above indicated placed between the p-type layer 11 and the counter electrode 13.

In a further alternative embodiment of the present invention, which will be indicated in the following as "reverse configuration", the device 1 has the following inverted structure.

Starting from the bottom, the device 1 comprises the substrate 2, the transparent conductive oxide layer 4, the solid state electrolyte layer 6, the p-type conductor layer 11, the semi-transparent photovoltaic layer 10, the n-type layer 8 and the transparent conductive layer 13 (counter electrode).

The device 1, of any of the embodiments above disclosed, is a solid-state photovoltaic and electrochromic device containing an innovative p-n junction on a single substrate 2. Both the materials of the layers 8 and 11 (n-type and p-type, respectively) have complementary electrochromic properties and the n-layer 8, the semitransparent photovoltaic layer 10 and the p-type layer 11 have mixed conducting properties, i.e. they conduct both ions and charge carriers (electrons or holes).

In the following, two possible operations of the device 1 will be disclosed.

The device 1, when exposed to light 100, produces a photovoltage, i.e. acts as a photovoltaic cell. As it is known in the art, the generated potential $V_{oc}$ is dependent on the level of quasi-Fermi of the materials present on the p and n junction.

In a first operating mode, in open circuit conditions (shown in the left part 1a of FIG. 1), the electrons coming from the photovoltaic layer 10 tends to fill the n-type electrochromic layer 8, attracting also the cations present in the p-type conductor layer 11 and in the electrolyte layer 12.

Coloration can be observed in the open-circuit condition, due to the generated voltage and the associated cations injection/attraction in the n-type electrochromic layer 8.

In closed circuit conditions (under illumination) the device 1 acts as photovoltaic producing electric energy. At this point, after the closure of a circuit (shown in the right part 1b of FIG. 1), the device 1, in addition to the production of electric current into the circuit, bleaches, albeit in a partial way, because of the energy levels of the materials involved in the stratigraphy of the device 1 itself.

In view of the above, it is clear that the device 1 is capable of both generating energy in a photovoltaic mode and to obtain an electrically induced change in color produced by photogenerated charge carriers.

This dual functionality of the p-type and n-type materials, which causes, under illumination condition, both the generation of electric energy (photovoltaic effect) and the coloration/bleach of the device 1 (electrochromic effect), the fact of being on the single substrate 2, the fact of bringing photovoltachromics on a solid-state device, the fact of ensuring a double functionality to the various layers and also to the device 1 itself, constitute aspects of significant innovation among multifunctional devices.

In a second operating mode of the device 1 of the present invention, the n-type layer 8 is a mixed ionic and electron conductor, leaving the electrochromic function to the p-type layer 11, i.e. the electrochromic functionality is attributed to the p-type layer 11 leaving the n-type layer 8 to serve both as ionic and electron conductor.

In this case, in open circuit conditions (shown in the left part 1 a of FIG. 1), the holes coming from the photovoltaic layer 10 tend to "fill" the p-type electrochromic layer 11, resulting in the oxidation of chromogenic anodic materials and transport of the cations into the n-type conductor layer 8 and the electrolyte layer 6.

Coloration can be observed already in the open-circuit condition, due to the photogenerated voltage and the associated cations injection in the n-type electrochromic layer 8.

In an alternative embodiment of the invention, both the n-type layer 8 and p-type 11 are mixed conductors having electrochromic complementary function, i.e. the electrochromic functionality is attributed to the p-type layer 11 as anodic electrochromic material and to the n-type layer 8 as cathodic electrochromic material.

In an alternative embodiment of the present invention, layers with dual function of electrodes are coupled one next to the other to obtain more devices arranged in tandem, as herein below disclosed. This creates devices with multiple features and simplified stratigraphy.

In this alternative embodiment of the present invention on top of the counter-electrode 13 there is firstly an electroluminescent multilayer and then a transparent counter-electrode.

The electroluminescent multilayer and the highly transparent counter-electrode act as an OLED device superimposed to the photovoltachromic device.

In this last embodiment the device 1 acts therefore as photovoltachromic and OLED device, i.e. it has three functions (electrochromic, photovoltaic and OLED) with respect to the two functions (electrochromic and photovoltaic) of the embodiment disclosed with respect to FIG. 1.

In this last embodiment, the generated photovoltage (p-n junction or p-i-n junction) activates the electrochromic cell and, further, the overhead counter-electrode, processed in a thin transparent and conductive film over the p-type layer 11, acts as a first electrode of the stack of layers deposited above to obtain the electroluminescent functionality.

One advantage of the device of the present invention is that, thanks to the possibility to achieve, even with low temperature processes, solid-state multifunctional films on a single substrate, it is possible to adopt any substrate, whether flexible or fabric. This ensures high compatibility with technical depositions technologies, e.g. screen-printing, ink-jet printing, spray coating or roll-to-roll.

The device according to the present invention overcomes the main limitations encountered in the production of chromogenic devices, matching, however, the photovoltaic, electrochromic and lighting functionality to others, integrating, in a single stratigraphy, layers of materials enabling the operation of multiple functions.

Finally, the combination of multiple functionalities in a single device allows to reduce the overall fabrication costs of the device, which becomes therefore competitive with respect to the other available technologies.

With reference to the device 1 of the reverse configuration, one advantage is the use of an inorganic n-type layer 8 as buffer layer to enhance the deposition of the transparent conductive layer 13, and finally the superimposition of the OLED structure, with benefits in terms of functionality.

At the same time, this reverse configuration improves the overall performances of the chromogenic component of the device 1, due to the best interface properties between the electrolyte layer 6 and the conductive substrate 2.

Clearly, the principle of the invention remaining the same, the embodiments and the details of production can be varied considerably from what has been described and illustrated purely by way of non-limiting example, without departing from the scope of protection of the present invention as defined by the attached claims.

The invention claimed is:

1. A multifunctional solid-state photovoltachromic device comprising at least one n-type layer and at least one p-type layer arranged to create a PN or PIN junction, said n-type layer and p-type layer comprising materials arranged to act as mixed conductors, thus allowing both charge transport and ion conduction, wherein the n-type layer and p-type layer are arranged to allow coloring of the device itself by using a photo voltage generated within the device itself.

2. The multifunctional device of claim 1, further comprising a counter electrode layer placed on top of the device and an OLED device superimposed to said counter electrode layer, wherein the counter electrode layer is arranged to act as a first electrode of a plurality of electroluminescent layers deposited above it to obtain an electroluminescent functionality.

3. The multifunctional device of claim 1, comprising in progressive sequence:
    a substrate;
    a transparent conductive oxide layer;
    a solid-state electrolyte layer;
    the n-type layer;
    a semitransparent photovolatic layer;
    the p-type layer;
    a solid-state electrolyte layer), and
    a counter electrode.

4. The multi-functional device of claim 2, comprising:
    a substrate;
    a transparent conductive oxide layer;
    a solid-state electrolyte layer
    the n-type layer;
    a semitransparent photovoltaic layer;
    the p-type layer;
    a solid-state electrolyte layer;
    the counter electrode;
    an electroluminescent multilayer; and
    a transparent counter-electrode.

5. The multifunctional device of claim 1, further comprising:
    a substrate, wherein the substrate is glass or polyethylene naphthalate,
    a transparent conductive oxide layer, wherein the transparent conductive oxide layer is -indium tin oxide (ITO), fluorine tin oxide (FTO) or graphene, a semitransparent photovoltaic layer, wherein the semitransparent photovoltaic layer is perovskite, silicon or a polymer, quasi solid and solid-state electrolyte layers, wherein the quasi solid and solid-state electrolyte layers are polymer electrolytes, proton conducting oxides, hybrid inorganic-organic polymer electrolytes or block copolymers with ionic liquids, and a counter electrode, wherein the counter electrode comprises a metal, a transparent conductive oxide or carbon based electrodes such as graphene and carbon nanotubes;

wherein he n-type layer is selected from the group consisting of $PCBM_{60}$, $TiO_2$, $ZnO$, $WO_3$, $WO_3$, $MoO_3$, $TiO_2$, $V_2O_5$ and $VO_2$; and wherein the p-type layer is selected from the group consisting of PANI, PANI:PSS, PEDOT, PEDOT:PSS, and mixed conducting oxides.

6. The multifunctional device of claim 5, wherein the polymer electrolytes of the quasi solid and solid-state electrolyte layers comprise ionomers, gel polymer electrolytes, plasticized polymer electrolytes, or ionic rubber polymer electrolytes.

7. The multifunctional device of claim 5, wherein the metal of the counter electrode comprises Au, Al, Pt, Ag or LiF.

8. The multifunctional device of claim 5, wherein the transparent conductive oxide of the counter electrode comprises ITO, FTO, or AZO.

* * * * *